(12) United States Patent
Miki et al.

(10) Patent No.: US 6,325,081 B1
(45) Date of Patent: Dec. 4, 2001

(54) WASHING APPARATUS AND WASHING METHOD

(75) Inventors: Nobuhiro Miki; Takahisa Nitta; Yasuyuki Harada, all of Tokyo; Tadahiro Ohmi, Miyagi-ken, all of (JP)

(73) Assignee: Kabushiki Kaisha Ultraclean Technology Research Institute, Tokyo (JP)

( * ) Notice: Subject to any disclaimer, the term of this patent is extended or adjusted under 35 U.S.C. 154(b) by 0 days.

(21) Appl. No.: 09/214,240

(22) PCT Filed: Jul. 3, 1997

(86) PCT No.: PCT/JP97/02311

§ 371 Date: May 17, 1999

§ 102(e) Date: May 17, 1999

(87) PCT Pub. No.: WO98/01896

PCT Pub. Date: Jan. 15, 1998

(30) Foreign Application Priority Data

Jul. 3, 1996 (JP) .................................................. 8-174005
Aug. 9, 1996 (JP) .................................................. 8-211557

(51) Int. Cl.⁷ ................................................... B08B 3/02
(52) U.S. Cl. .................................... 134/102.1; 134/100.1
(58) Field of Search ............................ 134/902, 100.1, 134/102.1, 102.2

(56) References Cited

U.S. PATENT DOCUMENTS

| | | | | |
|---|---|---|---|---|
| 4,749,440 | * | 6/1988 | Blackwood et al. | 134/902 X |
| 5,082,558 | * | 1/1992 | Burris | 134/102.1 X |
| 5,415,191 | * | 5/1995 | Mashimo et al. | 134/102.1 |
| 5,520,744 | * | 5/1996 | Fujikawa et al. | 134/102.1 X |

FOREIGN PATENT DOCUMENTS

| | | | | |
|---|---|---|---|---|
| 8630 | * | 1/1989 | (JP) | 134/902 |
| 1-259536 A | | 10/1989 | (JP) | H01L/21/304 |
| 2-246115 A | | 10/1990 | (JP) | H01L/21/304 |
| 4-92422 A | | 3/1992 | (JP) | H01L/21/304 |
| 29292 | * | 2/1993 | (JP) | 134/902 |
| 07014817 A | | 1/1995 | (JP) | H01L/21/304 |
| 07066164 A | | 3/1995 | (JP) | H01L/21/304 |
| 08055831 A | | 2/1996 | (JP) | H01L/21/304 |

* cited by examiner

Primary Examiner—Philip R. Coe
(74) Attorney, Agent, or Firm—Randall J. Knuth

(57) ABSTRACT

A washing apparatus and a washing method, which further improve a washing effect and enable highly clean washing with a small amount of chemical. Also, it is an object of the invention to provide a washing apparatus of high throughput involving rapid switching of various chemicals of high responsibility and capable of performing a series of washing operations at high speed.

The washing apparatus comprises undiluted cleaning liquid injection means for injecting an undiluted solution or undiluted gas of a cleaning liquid into a ultrapure water channel to make a cleaning liquid of a desired concentration, cleaning liquid supplying means connected to the super demineralized water channel for simultaneously supplying front and rear surface of a substrate with a cleaning liquid adjusted to a desired concentration or a ultrapure water, means for superposing ultrasonic wave or high frequency sound waves of 0.5 MHz or more on the substrate through the cleaning liquid, and means for rotating the substrate or means for moving either of the substrate and the cleaning liquid supplying means in one direction, whereby injection of the undiluted solution or undiluted gas into the ultrapure water channel is controlled to continuously perform washing of the substrate by the cleaning liquid and washing by the ultrapure water.

14 Claims, 8 Drawing Sheets

(a)

(b)

WASHING APPARATUS AND WASHING METHOD

TECHNOLOGICAL FIELD

The present invention relates to a washing apparatus and a washing method for substrates, and in particular, relates to an ultra small washing apparatus which makes possible the rapid washing of semiconductor wafers or substrates for LCDs using small amounts of cleaning liquid.

BACKGROUND ART

In semiconductor manufacturing, the washing processes are key processes in carrying out oxidation and diffusion, epitaxial growth, silicide formation, thin film formation, ion implantation, dry etching, and pre- or post-processing such as various types of heat treatment and the like. The proportion of the total process steps occupied by the washing processes is approximately 30%, and the area of the clean room occupied by the supply facilities, preparation facilities, and transportation facilities of the large amount of ultra-pure water or cleaning liquid, and by the washing facilities, is very large. Furthermore, the number of washing processes has increased with increasing integration of the semiconductor devices.

On the other hand, the degree of cleanliness of the wafers has approached a completely clean state, and the size of the wafers has further increased to a level of 12 inches, so that it will be increasingly difficult to guarantee uniformity and completeness of the washing.

Liquid crystal display (LCD) substrate washing processes are essentially identical to semiconductor substrate washing processes and are also in need of a thorough revolution. In the following explanation, the case of semiconductor wafers will chiefly be discussed as a representative of both semiconductor wafers and LCDs.

In the course of studying washing processes, the present inventors learned that in the "job shop method" employed in conventional semiconductor substrate washing processes, that is to say, in the method in which the wafers are transported to a washing area in each process step and after washing are transported to the treatment apparatus of the following step, the wafer movement distance is extremely large, and during wafer movement, the washing surfaces become recontaminated, and this constitutes a hindrance to development of more highly functional devices. In order to solve such recontamination problems, it is necessary to change the washing method from the conventional "job shop method" to a closed manufacturing continuous treatment method in which a washing apparatus is coupled to each process treatment apparatus and the pretreatment is conducted for that process. In order to accomplish this, it is desirable that a number of washing apparatuses equal to the number of washing processes be installed, and a reduction in size of the washing apparatuses is important.

Furthermore, the conventional washing process is conducted by means of a "batch method" in which wafers are immersed in a washing tank in units of ten, or in other words, by a "wafer parallel washing format". In order to increase throughput, it is necessary to reduce the gap between the parallel wafers, and as a result, it is fundamentally difficult to ensure uniformity of the insertion and discharge time of the washing solution per wafer, and the cleaning liquid flow. Furthermore, there is a drawback in that the front surface of the wafer is constantly affected by contamination from the rear surface of the wafer. Furthermore, there is also a problem in that time is required for the orderly movement of wafers to washing tanks having different cleaning liquids, and a large amount of time is required for the introduction of cleaning liquid into and discharge of cleaning liquid from the washing tanks.

Furthermore, in the conventional washing processes, there is a problem in that the amount of cleaning liquid or ultrapure water employed was very large.

The present invention has as an object thereof to solve the problems described above which were present in the conventional washing method. In other words, the present invention has as an object thereof to provide a washing apparatus which is capable of further improving the washing effect and enables highly clean washing using a small amount of chemicals.

Furthermore, it is an object to provide a washing apparatus of high throughput involving rapid switching of various chemicals of high responsiveness and capable of performing a series of washing operations at high speed.

Furthermore, it is an object to reduce the size of the washing apparatus itself.

Furthermore, the present invention has as an object thereof to provide a washing method which is capable of further improving the washing effect and which enables highly clean washing using a small amount of chemicals.

DISCLOSURE OF THE INVENTION

The washing apparatus of the present invention is provided with a cleaning liquid supply mechanism for supplying a cleaning liquid having a predetermined concentration simultaneously to front and rear surfaces of a substrate, a mechanism for superposing ultrasonic waves or high frequency sound waves of 0.5 MHz or more on the substrate through the cleaning liquid, and a mechanism for rotating the substrate or a mechanism for moving either of the substrate and the cleaning liquid supply mechanism in one direction, and this apparatus conducts washing of the substrate by means of the cleaning liquid.

The washing apparatus of the present invention is provided with an undiluted cleaning liquid injection mechanism for injecting an undiluted solution or an undiluted gas of a cleaning liquid into an ultrapure water channel to make a cleaning liquid of a desired concentration, a cleaning liquid supply mechanism connected to the ultrapure water channel which simultaneously supplies front and rear surfaces of a substrate with a cleaning liquid adjusted to a desired concentration or with ultrapure water, a mechanism for superposing ultrasonic waves or high frequency sound waves of 0.5 MHz or more on the substrate through the cleaning liquid, and a mechanism for rotating the substrate or a mechanism for moving either of the substrate and the cleaning liquid supply mechanism in one direction, and which is capable of continuously performing washing of the substrate by the cleaning liquid and washing the substrate by ultrapure water by controlling the injection of the undiluted solution or undiluted gas into the ultrapure water channel.

It is preferable that at least the substrate and the cleaning liquid supply mechanism be installed in a sealed container and that the substrate be washed in an inert gas atmosphere isolated from the outer atmosphere, and it is preferable that ultrapure water be employed which is subjected to deaeration treatment so that the concentration of dissolved gases is controlled.

The cleaning liquid supply mechanism supplies cleaning liquid to the front and rear surfaces of the substrate simultaneously using a nozzle which moves between the center and the periphery of the substrate, or alternatively, using a linear fixed nozzle which extends from the center in the circumferencial direction.

In the mechanism for superposing ultrasonic wave or high frequency sound waves of 0.5 MHz or more, oscillating elements which apply ultrasonic waves in the direction of the substrate are provided on the nozzles disposed on one side of the front and rear surface of the substrate or on both sides at non-overlapping positions.

When the ultrasonic waves or high frequency sound waves of 0.5 MHz or more are applied from one side, the angle of incidence of the ultrasonic wave or high frequency sound waves of 0.5 MHz or more to the substrate is preferably set so that the sound pressure at the surface opposite to the surface of incidence of the ultrasonic wave or high frequency sound waves of 0.5 MHz or more of the substrate is approximately maximal.

The undiluted cleaning liquid injection mechanism comprises a pump connected to the ultrapure water channel, and an undiluted solution container or undiluted gas container of the cleaning liquid; a prespecified amount of undiluted liquid or undiluted gas in injected into the ultrapure water channel, and cleaning liquid of a specified concentration is supplied to the nozzles.

Capillaries having a shape satisfying the relationships shown in formulas (1) and (2) below are disposed between the pump and the ultrapure water channel, and by spraying the undiluted solution of the cleaning liquid from these capillaries into the ultrapure water channel, the injected undiluted solution and the ultrapure water are instantaneously mixed.

$$V/t = (\pi r^4 \cdot P \cdot G)/(8\eta \cdot L) \quad (1)$$

$$k \cdot c \cdot \pi r^2 / L < 1 \times 10^{-7} \text{g/sec} \quad (2)$$

(Here, V/t indicates the undiluted solution injection rate per unit time($cm^3$/sec), r indicates the radius of the capillaries (cm), L indicates the length of the capillaries (cm), $\eta$ indicates the liquid viscosity (g/(cm sec)), P indicates the pump injection pressure (g/$cm^2$), G indicates the gravitational acceleration (cm/$sec^2$), k indicates the dispersion constant (cm/sec) and c indicates the cleaning liquid component concentration ($cm^3$)·)

Furthermore, a plurality of undiluted solution containers are connected with the pump via a plurality of capillaries having differing values of $r^4/L$, and by setting $r^4/L$, the supply rate of each undiluted solution taken in by the pump is controlled, and an undiluted solution having a freely selected composition is injected into the ultrapure water channel.

It is preferable that a pump be employed which moves a piston member provided on a cylinder part connected to the undiluted solution intake part and discharge part by means of a one-dimensional feeder mechanism using a motor, so that the undiluted solution or undiluted gas is taken in and discharged.

The undiluted cleaning liquid injection mechanism is a mechanism for injecting hydrogen fluoride gas into the ultrapure water channel and preparing a dilute hydrofluoric acid solution with a desired concentration; the anhydrous hydrogen fluoride storage container is connected with the ultrapure water supply channel via a pump, a switching valve for hydrogen fluoride gas and a purge gas, and capillaries, and it is preferable that the ratio of the water flow rate to the hydrogen fluoride gas flow rate within the capillaries be 0.5 or less.

The undiluted cleaning liquid injection mechanism is a mechanism for injecting ozone gas into the ultrapure water channel and thus preparing an ozonated water cleaning liquid at a desired concentration; the ultrapure water channel is connected via a valve to a container, and ultrapure water discharge pipes provided at this container are connected to the cleaning liquid supply mechanism, an ozone gas introduction port and discharge port are provided in the lower and upper parts of the container, and the ozone gas introduction port is connected to an ozone gas source, while the ozone gas discharge port is connected to an ejector, either directly or via a valve.

In the present invention, undiluted liquids and undiluted gases which contain hydrofluoric acid, ozone, hydrogen peroxide, or hydrogen fluoride gas are employed, and it is preferable that the parts supporting the end portions of the substrates, the nozzle parts, the parts covering the oscillator from the cleaning liquid, and in the pump and the capillaries, the parts which come into contact with the cleaning liquid or the undiluted solution thereof or the undiluted gas be constructed from quartz, silicon, silicon carbide, alumina, sapphire, amorphous carbon or metal, the surface of which has been subjected to passivation using an oxide layer or a fluoride layer, or fluorine resin which gives rise to little particulate matter or other corrosion-resistant resins. The small installed surface area thereof has a very large effect on the reduction of the clean room surface area.

The installed surface area of the washing apparatus has a surface area such that one side thereof is the diameter of the substrate or approximately twice one side thereof. This may be achieved by employing an ultrapure water channel and an undiluted cleaning liquid injection pump system, and not employing chemical supply facilities such as dilution apparatuses, dilute cleaning liquid transport apparatuses, dilute cleaning liquid storage tanks, recirculation and filtration apparatuses, or pumps or piping systems.

The washing method of the present invention is one which employs the washing apparatus of the present invention described above and contains at least the following processes;

1) a process for supplying ultrapure water containing ozone to front and rear surfaces of the substrate and washing the substrate,
2) a process for supplying ultrapure water containing surfactants, hydrofluoric acid and hydrogen peroxide to front and rear surfaces of the substrate and washing the substrate,
3) a process for again supplying ultrapure water containing ozone to front and rear surfaces of the substrate and removing the surfactant,
4) a process for supplying dilute hydrofluoric acid to front and rear surfaces of the substrate and washing the substrate,
5) a process for supplying ultrapure water to a front surface or front and rear surfaces of the substrate and washing the surface of the substrate after washing with dilute hydrofluoric acid, and
6) a process for applying nitrogen gas or another inert gas to the surface of the substrate and drying this; in the processes up to the drying process, a cleaning liquid or ultrapure water is constantly supplied to the front and rear surfaces of the substrate, and furthermore, where necessary, ultrasonic waves or high frequency sound waves of 0.5 MHz or more are applied to the substrate.

Figure 1:
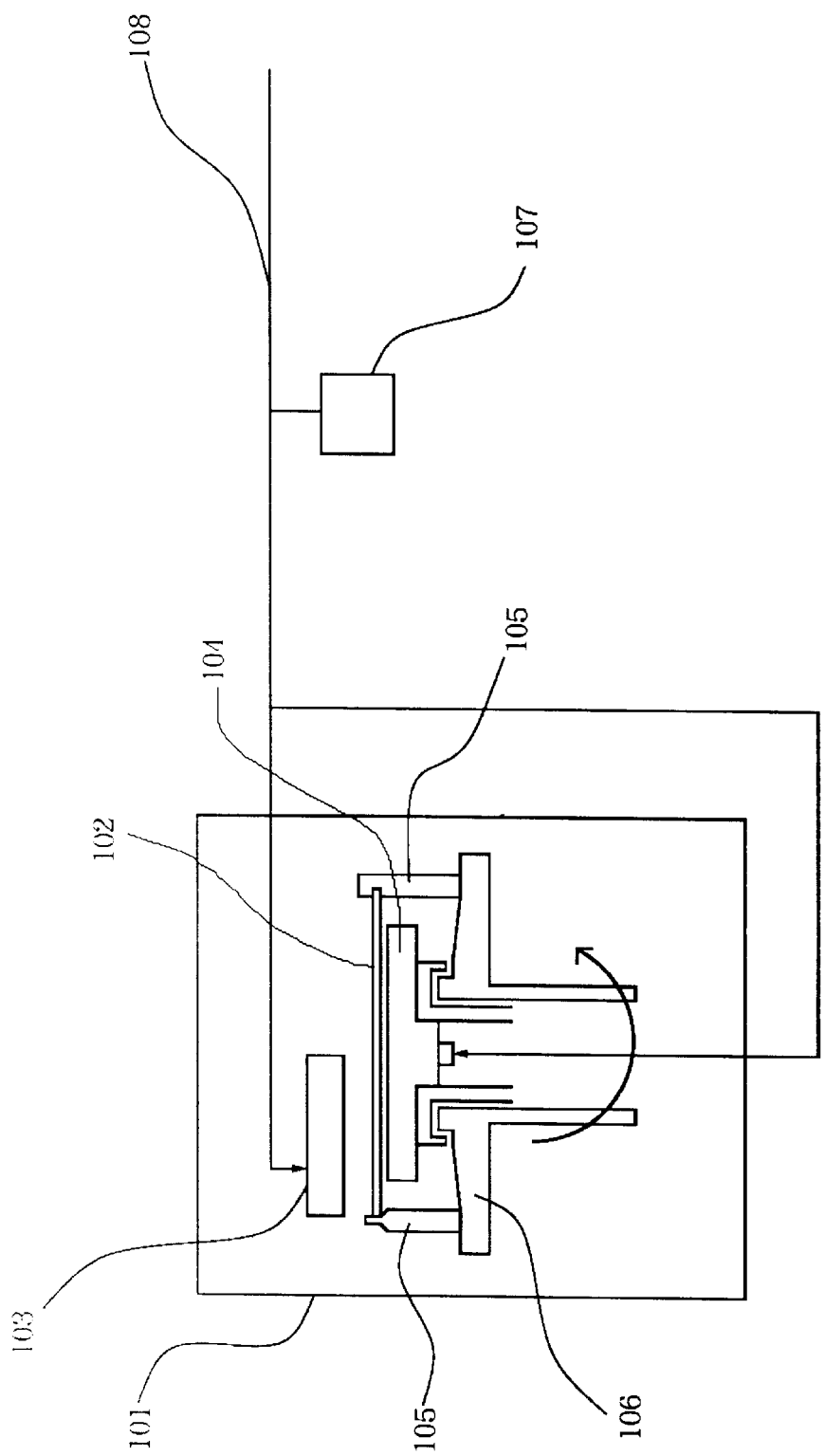
FIG. 1 is a schematic diagram showing an example of a washing apparatus in accordance with the present invention.

DESCRIPTION OF THE REFERENCES 101 sealed container,
102 substrates such as silicon wafer or the like,
103 nozzle for front surface washing,
104 nozzle for rear surface washing,
105 wafer holding member,
106 rotating member,
107 undiluted cleaning liquid injection mechanism,
108 ultrapure water channel,
200, 300 ultrapure water production apparatuses,
201, 301 ultrapure water channels,
202, 301-304 undiluted solutions of chemical cleaning liquids,
203, 305 valves,
401 ultrapure water channel,
402 ultrapure water channel valve,
403 chemical liquid supply line,
404' capillary,
404 valve,
405 pump,
406 pipe,
407 undiluted solution tank,
501 ball valve of chemical discharge port,
502 ball valve of chemical input port,
503 piston,
504 gap between piston and inner wall cylinder,
405 input port for ultrapure water supplied to gap 504,
506 output port for ultrapure water,
507 motor,
601 wafer,
602, 603 nozzles,
604, 605 ultrasonic wave oscillators,
606 wafer holding member,
610 ultrapure water supply line,
611 hydrofluoric acid injection,
612 hydrogen peroxide injection,
613 surfactant injection,
701 ultrapure water channel,
702 valve,
703 supply line for cleaning liquid,
704 capillary,
705 pump,
706 pipe,
707, 707' undiluted solution containers,
708, 708' capillaries,
901 container,
902 ultrapure water (ozonated water)
903 ultrapure water channel,
904, 907, 908 valves,
905 ultrapure water outflow channel,
906 909 pipes.

BEST MODE FOR CARRYING OUT THE INVENTION

The characteristic features of the washing apparatus of the present invention will be discussed hereinbelow.

(1) A reduction in the shape and volume of the washing apparatus is possible.

A wafer which is set for washing is not moved from the initiation of washing until washing by means of various chemicals, washing by ultrapure water, and drying are completed. This is the fundamental conception behind the reduction in size of the washing apparatus, and by means of this, the surface area of the washing apparatus need only be approximately 4 times the surface area occupied by the wafer. In contrast, washing apparatuses operating by the conventional batch immersion method moved wafers in order to washing tanks for each washing step, so that a large surface area was required.

Furthermore, since the structure is such that an undiluted chemical solution of chemicals is injected into the ultrapure water channel so as to achieve the necessary concentration, the continuous facilities which were required in the conventional washing apparatuses (that is to say, the apparatus for diluting the chemicals to the necessary concentration for washing, which occupied a large surface area, the storage tank for the chemical cleaning liquid, the transportation pipe for the chemical cleaning liquid, the recirculation and filtration apparatus for the chemical cleaning liquid, and the chemical supply pump and the like) are unnecessary. That is to say, by providing a number of injection ports equal to the types of chemicals in the ultrapure water supply line, and by controlling the opening and closing of these injection ports, the chemical facilities, chemical transport facilities, and chemical storage tanks become unnecessary, and it becomes possible to set the various chemicals to freely determined compositions, and to alter these compositions in accordance with the purpose of washing.

(2) It is possible to greatly increase operating time efficiency of the washing apparatus.

A method in which various chemicals at undiluted concentrations are injected into an ultrapure water channel and the result is supplied to front and rear surfaces of wafers does not merely have the effect of reducing the surface area of the washing apparatus described above as installed, but also maximizes the time efficiency of the washing with various chemicals and the washing with ultrapure water. In other words, the switching of the chemicals and switching of the substrate present in the conventional method is eliminated, and furthermore, it is possible to conduct the instantaneous preparation of chemicals and the instantaneous switching of chemical washing, so that there is absolutely no idle time present in the washing.

Furthermore, by applying ultrasonic waves or high frequency sound waves to the front and rear surfaces of the substrate, it is possible to increase the washing effects and to shorten the washing time.

(3) It is possible to reduce the amount of ultrapure water and chemicals employed.

The washing function is made more efficient. This is a fundamental conception underlying the reduction in the amount of ultrapure water and chemicals employed. By means of spin rotation, a film of cleaning liquid is formed on the front and rear surfaces of the wafer, and the effect which results when ultrasonic waves are simultaneously superposed, together with the effect of a reduction in time described in (2), makes it possible to reduce the amount of ultrapure water and chemicals employed to within a range of 1/3 to 1/5 that of the conventional art.

In other words, the feed rate of the ultrapure water and various chemicals employed in the washing is reduced to the vicinity of the limit at which a liquid film is formed in a static manner on the front and rear surfaces of a wafer subjected to spin rotation, and thereby, the amount of ultrapure water and various chemicals employed may be reduced to a fraction of that employed in the conventional batch immersion washing method, and it is thus possible to conserve natural resources.

An example of a washing apparatus in accordance with the present invention is shown in FIG. 1; the present invention will be explained in detail using this figure.

In FIG. 1, reference 101 indicates a sealed container, reference 102 indicates a substrate such as a silicon wafer or the like, and references 103 and 104 indicate cleaning liquid supply mechanisms, comprising nozzles for washing, respectively, the front and rear surfaces of the wafer. The wafer is supported by a wafer support member 105 which supports the ends of the wafer at 3 or more points, and this is rotated by rotating member 106.

An ultrapure water channel 107 is connected to nozzles 103 and 104, and also connected thereto is an undiluted cleaning liquid injection mechanism 108, which injects a desired amount of an undiluted solution or undiluted gas of the cleaning liquid into the channel, producing a cleaning liquid of the specified concentration, and the cleaning liquid set to a desired concentration is simultaneously supplied to the front and rear surfaces of the wafer from nozzles 103 and 104.

Furthermore, an oscillator for ultrasonic waves or high frequency sound waves of 0.5 MHz or more (hereinbelow referred to collectively as "ultrasonic waves") is disposed on at least one of the front surface and rear surface nozzles, and this applies ultrasonic waves to the substrate via the cleaning liquid thin film, and increases the washing effect of the substrate.

By providing at least one oscillator, the ultrasonic waves propagate through the substrate to the other side of the substrate, so that if cleaning liquid is present on the opposite surface, it is possible to simultaneously and effectively wash that surface as well.

The ultrasonic waves applied from the oscillator propagate through the cleaning liquid and the substrate to the opposite side of the substrate, and as the sound pressure of the ultrasonic waves on the opposite surface of the substrate increases, the washing effect on the opposite surface of the substrate is also increased. The sound pressure of the ultrasonic waves on the opposite surface of the substrate varies depending on the angle of incidence of the ultrasonic waves into the substrate, the thickness of the substrate, the frequency, and the like, so that it is preferable that the angle of incidence of the ultrasonic waves be regulated so that the sound pressure of the ultrasonic waves on the opposite surface of the substrate is approximately maximal.

Furthermore, it is preferable that the ultrasonic wave oscillators be provided on both nozzles. In such a case, the oscillators must be installed so that the directions and positions applied by the nozzles do not overlap, so that the two sound waves do not interfere with one another.

Furthermore, in the example shown in FIG. 1, fixed linear nozzles are employed; however, point nozzles may also be employed, and in such a case, in order to wash the entirety of the surfaces of the substrate in a uniform manner, it is necessary that the nozzles be made to move in the radial direction of the wafer. Furthermore, the shape of the rear surface nozzles should be identical to that of the front surface nozzle. In the example shown in FIG. 1, fixed linear nozzles are employed.

In order to efficiently propagate the ultrasonic waves and thus increase the washing effect on the front and rear surfaces of the substrate, it is necessary to form a film of cleaning liquid from the nozzle to the surface of the substrate without the inclusion of air bubbles. Furthermore, the thickness of the liquid film is set to the optimal thickness in order to increase the washing effect; this is determined by the distance between the nozzles and the substrate.

Furthermore, the relative speed of the liquid with respect to the substrate surface is a factor increasing the washing effect, and this is related to the rotational speed of the substrate. In view of this, the rotational speed of the substrate should be within a range of 1,000–3,000 rpm, and 2,000 rpm is particularly preferable from the point of view of washing efficiency.

An ultrasonic wave frequency within a range of 0.5–3 MHz is preferably employed. At levels of 2 MHz or greater, the washing effect is further improved. However, at levels or 2 MHz or more, the sound pressure is reduced as a result of the gases dissolved in the liquid, so that the use of deaerated liquid is preferable.

Although not shown in FIG. 1, a nozzle for an inert gas such as $N_2$ gas or the like which is used for drying after washing is provided in the washing apparatus, and drying of the substrate is conducted while rotating it at a high speed (2,000–4,500 rpm) while blowing $N_2$ gas onto at least the front surface of the substrate.

Figure 2:
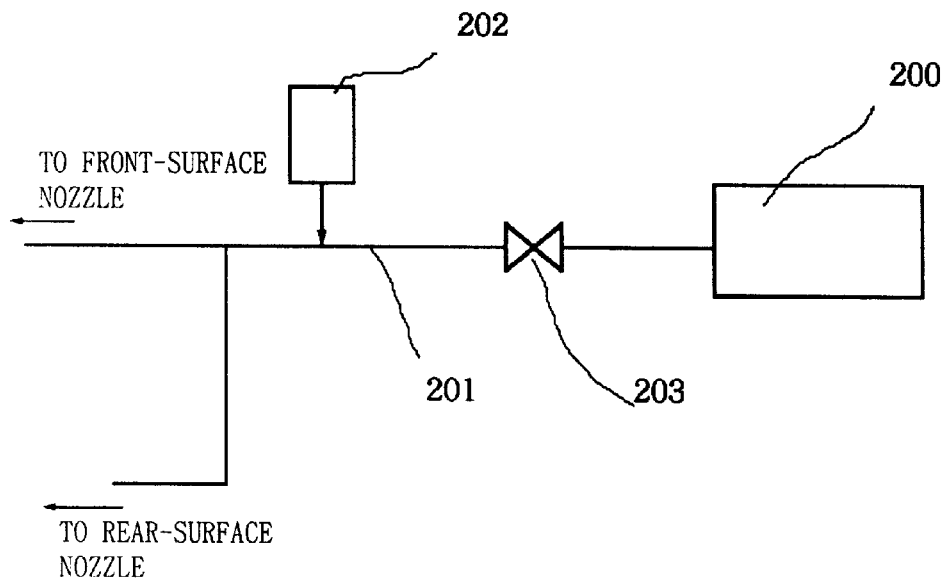
FIG. 2 is a schematic diagram showing an example of a cleaning liquid supply system.

As shown in FIG. 2, with respect to the supply method for hydrofluoric acid and hydrogen peroxide cleaning liquids, it is desirable that a specified amount of an undiluted solution 202 of the cleaning liquid (for example, approximately 1/100 of the ultrapure water) be injected into the ultrapure water channel 201 leading from the ultrapure water production apparatus 200, that this be thus set to a desired concentration, and supplied to the nozzles. In this manner, by setting the number of valves proved in the ultrapure water channel 201 to 1 (203), it is possible to reduce the effect of particle generation accompanying the opening and closing of the valves, a recirculation system for the cleaning liquid becomes unnecessary, and moreover, the cleaning liquid tank and the like are greatly reduced in size. Furthermore, it is also possible to avoid the generation of particles which enter during the conventional production of the dilute liquid.

A case will be considered in which, for example, an oxide film is removed and ultrapure water rinse washing is conducted. It was conventionally the case that when the hydrofluoric acid supply system and the pure water supply system conducted supply along differing lines, a specified amount of hydrofluoric acid solution was supplied from the nozzle and the oxide film was etched, and after this, when the wafer surface was rinsed using ultrapure water, the bare silicon surface resulting from the removal of the oxide film using hydrofluoric acid was susceptible to the deposition of particles, and when the valve was opened in order to supply ultrapure water for the rinse washing, particles were generated by the valve and this caused a problem in that the silicon surface became contaminated. In contrast, by means of the structure shown in FIG. 2, the ultrapure water constantly flows during washing, and even if particles are generated in an isolated manner in the ultrapure water from the valve after washing, this particulate matter does not reach the wafer surface after washing. Furthermore, if a valve is employed in the ultrapure water line in order to supply undiluted solution, particles are generated as a result of the opening and closing thereof; however, the amount of undiluted solution supplied is approximately 1/100 that of the total amount of cleaning liquid, so that it is possible to greatly reduce the amount thereof. Furthermore, as described hereinafter, by employing a pipe structure which does not use valves, and moreover using a pump which gives rise to very little particulate matter, it is possible to completely solve the problem of particle contamination in the undiluted solution.

By means of employing the structure shown in FIG. 2, the size of the undiluted solution container may be approximately 1/100 that in the case in which diluted liquid is stored. Furthermore, conventionally, even when particle free undiluted solution was employed, in the process of diluting this to a desired concentration to produce a cleaning liquid (for example, when 50% HF was diluted to 0.5 weight percent), problems such as particle generation and the like were present; by means of the structure shown in FIG. 2, it is possible to reduce the effect thereof.

Furthermore, in FIG. 2, the installation of a filter on the downstream side of valve 203 tends to improve the particulate level in the ultrapure water without disturbing the mechanisms described above for suppressing the effects of particles from the valve, and thus may be employed as a more complete mechanism.

Figure 3:
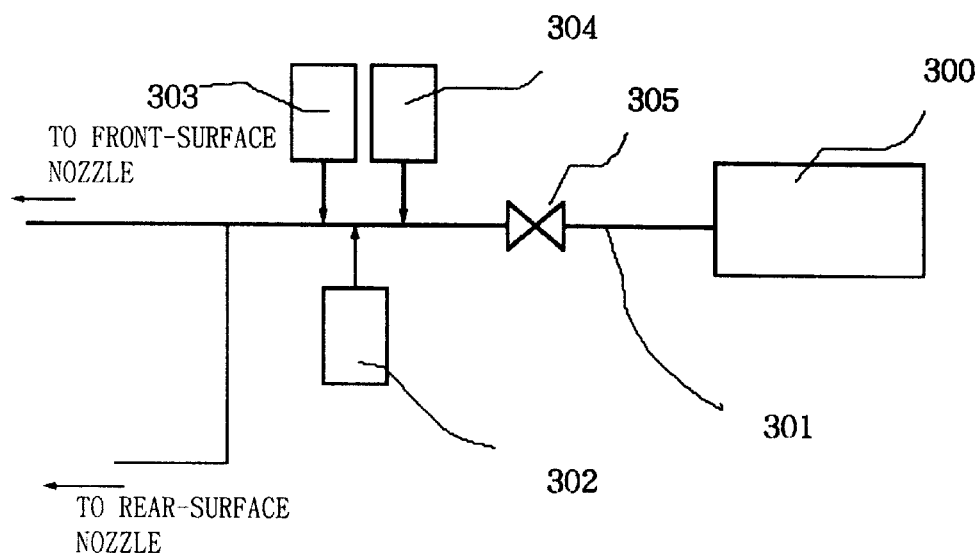
FIG. 3 is a schematic diagram showing another example of a cleaning liquid supply system.

In the present invention, depending on the types of chemicals employed in the washing process, only that amount of nozzles and injection mechanisms for the ultrapure water channel and the undiluted cleaning liquid corresponding to the types of cleaning liquid need be provided. For example, in order to conduct the normal temperature washing process developed by the present inventors, comprising 1) ozonated water washing, 2) hydrofluoric acid/ hydrogen peroxide/surfactant washing, 3) ozonated water washing, 4) hydrofluoric acid washing, and 5) ultrapure water washing, it only necessary to provide three cleaning liquid supply systems, for ozonated ultrapure water, hydrofluoric acid/hydrogen peroxide/surfactant, and hydrofluoric acid, together with a nozzle. On the other hand, as shown in FIG. 3, a structure may be employed in which all undiluted solution containers described above are connected to a single ultrapure water channel, so in other words, a $HF/H_2O_2$/surfactant container 302, a HF aqueous solution container 303, and $O_3$ water container 304 are connected to a single ultrapure water channel via pumps, and the various undiluted solutions are injected in specified amounts during use. By means of this, it is possible to conduct washing using a variety of cleaning liquids using a single nozzle and a single ultrapure water channel 301. Moreover, the injection of undiluted solutions into the ultrapure water channel may be conducted for each composition component of the cleaning liquid (HF, $H_2O_2$, $O_3$ surfactant).

The washing method will explained using the washing apparatus of FIG. 3. After a wafer has been set on the holding member using a wafer transport apparatus, the substrate is rotated at 1,000–3,000 rpm. Ultrapure water supplied from the ultrapure water channel is supplied simultaneously to the front and rear surfaces of the substrate from nozzles, and then ozonated water is supplied in a continuous manner from the undiluted solution container 304 to the ultrapure water channel, and ozonated water washing of the substrate is conducted. Organic impurities, in particular, are removed from the surfaces of the substrate by means of the ozone washing.

After the passage of a specified period of time, the injection of ozonated water is halted, and after only ultrapure water is supplied to the substrate, $HF/H_2O_2$/surfactant is injected from the undiluted solution container 302 into the ultrapure water channel 301, and washing is conducted using ultrapure water containing $HF/H_2O_2$/surfactant. During this washing, ultrasonic waves are applied to the substrate from an ultrasonic wave oscillator provided within the nozzle via a thin film of the cleaning liquid. By means of this washing, metallic and particulate contaminants are particularly removed.

After washing using $HF/H_2O_2$/surfactant, the injection of the undiluted solution is halted, and ultrapure water is supplied to the front and rear surfaces of the substrate. Washing is again conducted using ozonated water, and the small amount of surfactant adsorbed to the surfaces is degraded and removed. Next, HF aqueous solution is injected from the undiluted solution container 303 into the ultrapure water channel 301, and the oxide film produced in the previous process is etched, and the dangling bonds of the silicon are hydrogen-terminated. During this, it is possible to apply ultrasonic waves in the same manner as in the previous process.

The injection of HF aqueous solution is then halted, and rinsing is conducted solely by means of ultrapure water, whereupon valve 305 is closed and the supply of ultrapure water is halted. At this time, the particles produced by the closing of the valve do not reach the surfaces of the substrate.

Finally, $N_2$ gas is sprayed from an $N_2$ gas nozzle which is not depicted in the figure onto the substrate, and the drawing of the substrate is conducted. At this time, it is preferable that the substrate be rotated at a speed within a range of 2,000–4,000 rpm. After drying, the substrate is transferred to the subsequent processing apparatuses by a substrate transport mechanism and through a gate valve.

In the above washing, cleaning liquid or ultrapure water is continuously supplied to the surface of the substrate once the substrate has been set and up until the drying process, and furthermore, the switching of the type of cleaning liquid and ultrapure water is determined by whether undiluted washing solution is injected or not, so that it is possible to avoid instances of the introduction of particulate matter or impurities, and it is thus possible to conduct washing of higher cleanliness.

Furthermore, in the normal temperature washing method described above, the management of impurities and particulate matter is extremely important after the hydrofluoric acid washing (the fourth process). In this process, the oxide film produced in prior processes is removed, and an active silicon surface is exposed, so that the yield of highly functional semiconductors is greatly affected by whether the dangling bonds of the silicon can be hydrogen-terminated in an atmosphere in which particulate matter and impurities are strongly suppressed.

Presently, among valves and pumps and the like, those for use with gas are cleaner than those for use with liquids, and hydrogen fluoride gas can be obtained in a more pure state than hydrofluoric acid itself. Accordingly, in the fourth process described above, it is more preferable that hydrogen fluoride gas be used than that an aqueous solution of hydrofluoric acid be used.

Furthermore, in the case of washing with ozonated water, for the same reasons as described above, and in cases where water having a high concentration of ozone is required, it is preferable to inject ozone gas rather than to inject ozonated water.

In the normal temperature washing described above, ultrasonic waves are applied together with the supply of the cleaning liquid, and by means of this, the washing effect increases in a synergistic manner.

Figure 4:
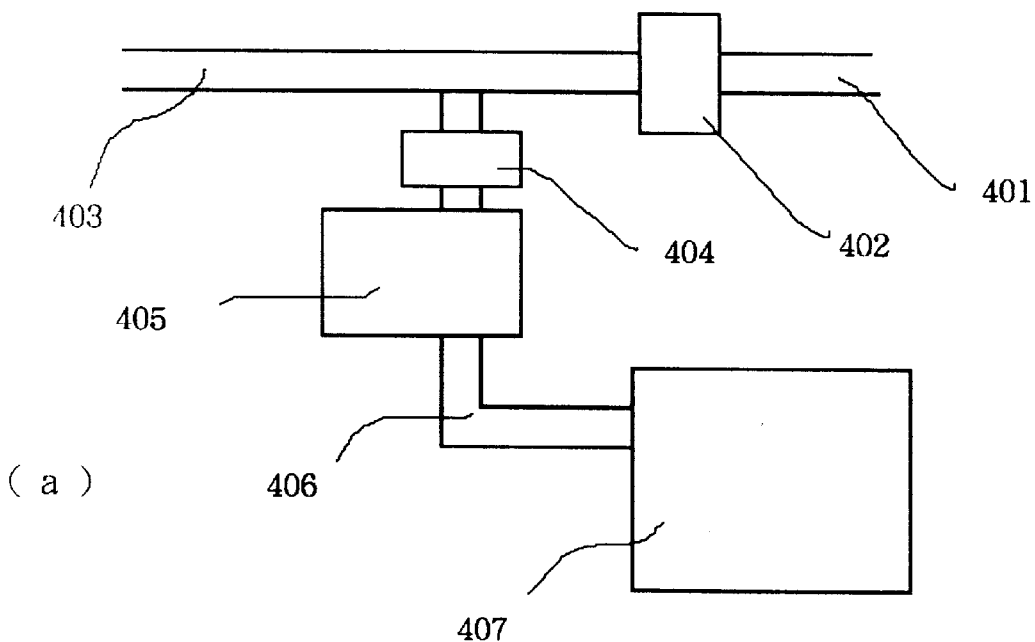
FIG. 4 is a schematic diagram showing an example of the chemical injection of the cleaning liquid supply system.
Figure 4:
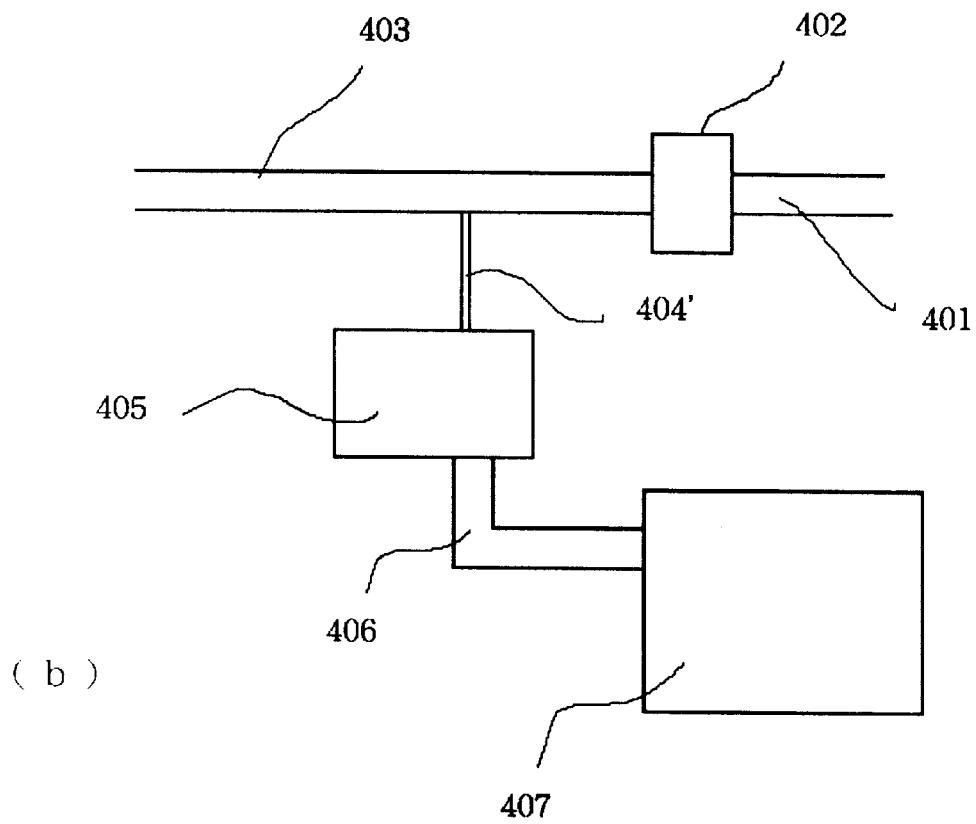

As a mechanism for injecting undiluted washing solution into the ultrapure water channel, as shown in FIG. 4(a), a method may be employed in which undiluted solution is supplied to ultrapure water channel 401 from an undiluted solution container 407 via pipe 406 and by means of a pump 405 via a valve 404; however, such a structure has two problems. The first is that as result of the dead space of valve 404, where liquid is supplied, there is a response delay in the cleaning liquid concentration. Another problem is that particles are generated by means of the opening and closing of the valve. In FIG. 4, reference 402 indicates the ultrapure water channel valve, while reference 403 indicates the supply line for the cleaning liquid which is prepared.

As a result of diligent investigations directed toward solving the problems described above, the present inventors have discovered that, as shown in FIG. 4(b), the connection of pump 405 to ultrapure water pipe 401 via a capillary 404', without the use of valve 404, is highly effective for solving the problems described above.

Using a structure such as that shown in FIG. 4(b), if the shape of the capillary 404' satisfies the conditions that even if there is dispersion of the chemical into the ultrapure water after the stoppage of pump 405, there is no effect, and the chemical can be supplied by the pump in sufficient amounts, it is possible to stably supply the chemicals without the use of a valve. Here, the shape of the capillary preferably meets the follow conditions.

Undiluted solution injection rate:

$$V/t = (\pi r^4 \cdot P \cdot G)/(8\eta L) \qquad (1)$$

Undiluted solution component dispersion rate:

$$k \cdot c \cdot \eta r^2 / L < 1 \times 10^{-7} \text{g/sec} \qquad (2)$$

(Here, V/t indicates the undiluted solution injection rate per unit time (cm$^3$/sec), r indicates the radius of the capillary (cm), L indicates the length of the capillary (cm), $\eta$ indicates the liquid viscosity (g/(cm)sec)), P indicates the pump injection pressure (g/cm$^2$), G indicates the gravitational acceleration (cm/sec$^2$), k indicates the dispersion constant (cm$^2$/sec), and c indicates the cleaning liquid component concentration (g/cm$^3$)·)

Furthermore, it is desirable that a pump which does not give rise to particulate matter, which has been developed by the present inventors, be employed as the pump used in the present invention. This is depicted in FIG. 5.

Figure 5:
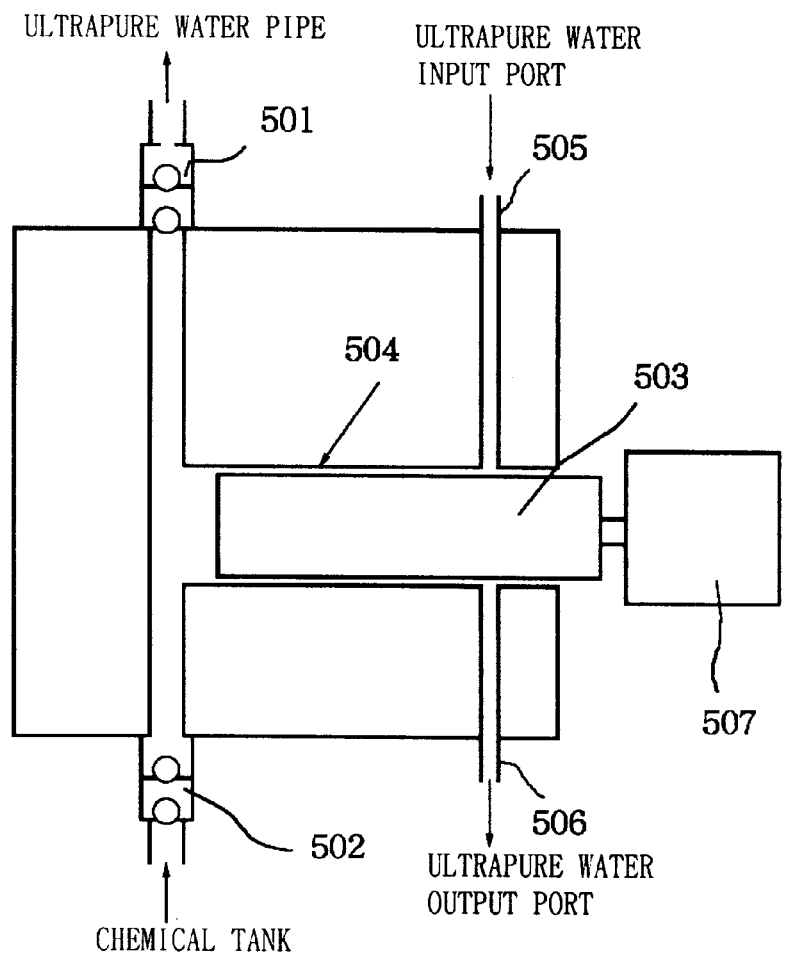
FIG. 5 is a schematic diagram showing an example of a pump which is preferably employed in the washing apparatus of the present invention.

In FIG. 5, reference 501 indicates the ball valve of a chemical discharge port, reference 502 indicates the ball valve of a chemical intake port, reference 503 indicates a piston, reference 504 indicates a gap between the piston and the inner wall of the cylinder, reference 505 indicates an input port for the ultrapure water supplied to the gap, reference 506 indicates an exit port for this ultrapure water, and reference 507 indicates a motor which drives piston 503 in continuously reciprocating motion along the axial direction.

The gap 504 between the piston and the inner wall of the cylinder is formed uniformly within the region of movement of the piston so as to be a few tens of micrometers or less. Furthermore, ultrapure water is supplied to this gap 504 from the input port 505 of the ultrapure water.

By means of this chemical pump, the chemicals are injected into the ultrapure water channel (not depicted in the figure) from the chemical intake port 502 by the action of piston 503. The characteristic feature of this pump is that a seal is not employed in the interior of the apparatus. The gap between the piston and the inner wall of the cylinder is continuously filled with either chemicals or ultrapure water, so that operation is conducted without contact with the inner wall of the cylinder. A constant amount of chemicals is continuously exhausted from the ultrapure water exit port 506 through this gap. The exhaust amount is a few percent of the amount of chemicals supplied or less when, for example, the gap is 10 micrometers.

Because there is no seal, and because the piston and the inner wall of the cylinder do not come into contact with each other during operation, this pump has no source of particle generation. Accordingly, the number of particles present in the chemicals fed is not contaminated in any way by the pump.

The pump depicted in FIG. 5 uses inorganic materials such as quartz or sapphire or the like, which give rise to little particulate matter, or organic resin materials such fluorine resins or the like, which also give rise to little particulate matter. The use of sapphire, with respect to hydrofluoric acid chemicals, is especially preferable.

Figure 7:
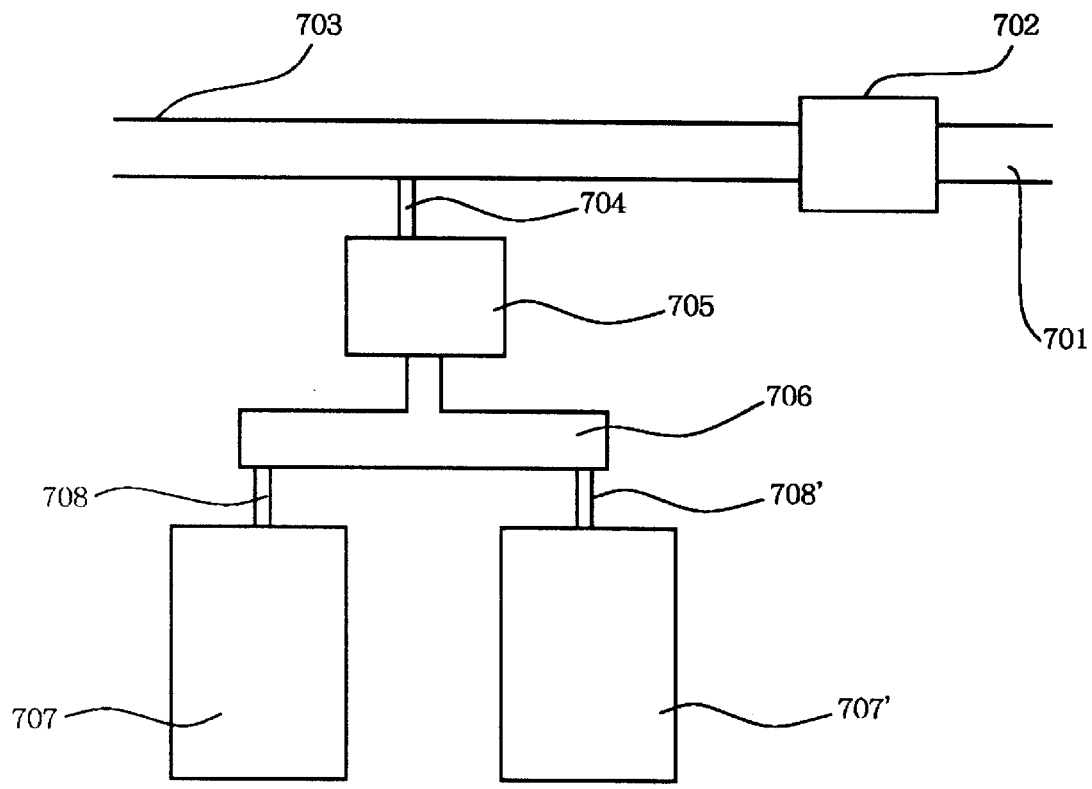
FIG. 7 is a schematic diagram showing a cleaning liquid supply system which is preferably employed in the washing process of the semiconductor washing process.

As shown in FIG. 7, in the undiluted washing solution injection mechanism of the present invention, the pump is connected with a plurality of undiluted solution containers via capillaries having different shapes ($r^4/L$), and thereby, it is possible to inject a plurality of undiluted solutions into the ultrapure water channel using a single pump. In FIG. 7, reference 701 indicates the ultrapure water channel, reference 702 indicates a valve, reference 703 indicates a supply line for cleaning liquid, reference 704 indicates a capillary, reference 705 indicates a pump, reference 706 indicates a pipe, references 707 and 707' indicate undiluted solution containers, and references 708 and 708' indicate capillaries having differing shapes.

In this way, by determining the shapes ($r_4/L$, where r indicates the radius and L indicates the length) of the capillaries in accordance with the desired mixing ratio, it is possible to inject a plurality of chemicals at desired proportions using a single pump. By means of this, it is possible to achieve a further miniaturization of the apparatus as a result of reducing the number of pumps, and it is possible to conduct even cleaner washing as a result of the reduction in points at which particulate matter is generated.

Next, an injection mechanism for ozone gas which serves to produce the ozonated water cleaning liquid will be explained using FIG. 9.

Figure 9:
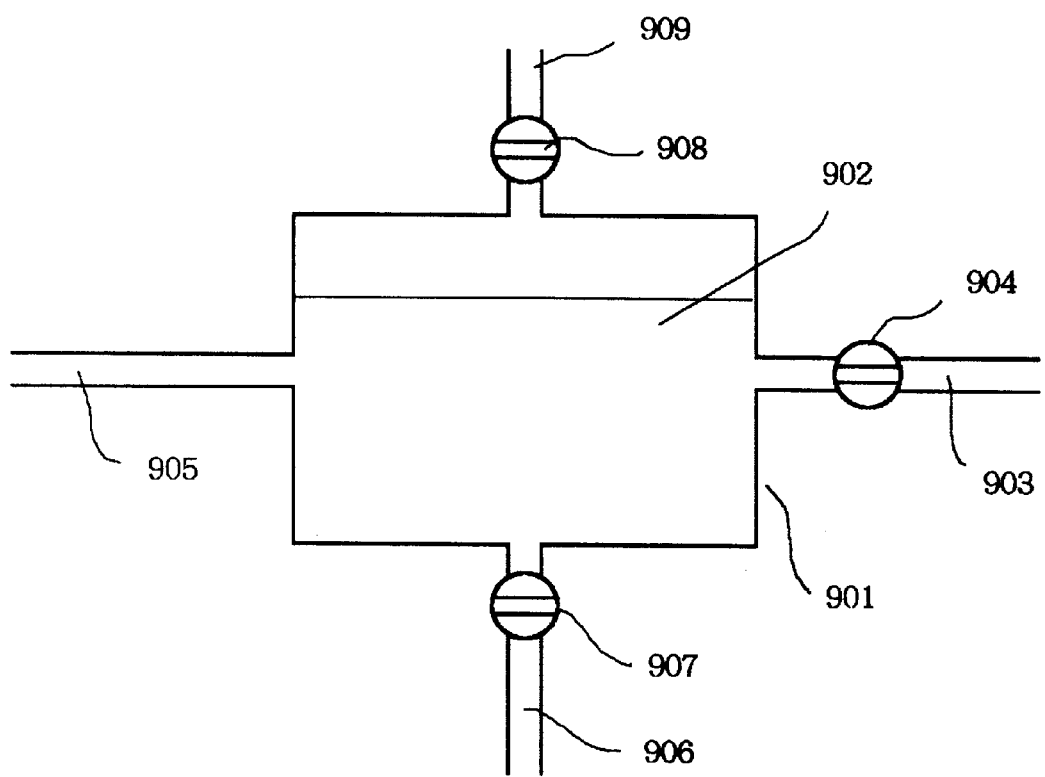
FIG. 9 is a schematic diagram showing an example of an injection apparatus for ozone gas.

FIG. 9 brings a gas containing ozone into contact with ultrapure water and causes this to dissolve. The ultrapure water 902 is introduced from the ultrapure water channel 903 into a container 901 having a standard volume via valve 904.

A gas containing ozone is introduced into container 901 from an ozone gas generating apparatus (not depicted in the figure) via pipe 906 and valve 907, and after bubbling, the.

gas is exhausted via valve 908 and pipe 909. When the pressure of the gas containing ozone is introduced is low, it is preferable that the ozone gas be removed by suction using an ejector (not depicted in the figure).

As a result of the bubbling of the gas containing ozone, ozonated water 902 in which ozone is dissolved is supplied to the nozzle via outflow channel 905. The ozone concentration in the ozonated water has a fixed value which is determined by the flow rate of the ultrapure water, the flow rate of the gas containing ozone and the ozone concentration therein, as well as the volume of the container 901.

In the above way, it is possible to intermittently supply ozonated water when necessary.

In the present invention, as shown in FIG. 1, it preferable that undiluted chemical solutions be injected in specified amounts into the ultrapure water channel to achieve desired concentrations, and that this then be supplied to the substrate from a nozzle and washing conducted; however, it is also possible to prepare the cleaning liquid in advance in desired concentrations, and supply this directly from the nozzle by means of a pump. In such a case, the pump which does not give rise to particulate matter shown in FIG. 5 is preferably employed.

The above explanation dealt with circular substrates and centered on silicon wafers; however, when a rectangular substrate such as a glass substrate or the like which is employed as a thin film transistor substrate in liquid crystal devices is to be washed, as the substrate increases in size, it is difficult to rotate it. In such a case, a method should be adapted in which either the substrate or the nozzles (a nozzle is preferable which has a width which is equal to or greater than the length of one side of the substrate) is moved and washing is conducted.

In the present embodiment, the use of organic resins is to be avoided as materials for the nozzle types, valves, pumps, and the like, and in particular, in movable or slidable parts which are likely to give rise or particulate matter, and the use of inorganic metals or insulators is preferable; for example, quartz, silicon, silicon carbide, alumina, sapphire, amorphous carbon, metals subjected to oxide film or fluoride film treatment, materials having alumina films formed on the surface thereof (for example, those subjected to alumite treatment and subsequently polished), or fluorine resins or other corrosion-resistant resins may be selectively employed, depending on the type of chemical employed. Furthermore, it is possible to use SUS316L, aluminum, or alloys thereof or the like.

The apparatus characteristics described above may be applied to the washing of LCDs with variations originating in the difference between the shape of the wafer and the shape of the LCDs, for example, with variations such that the installed surface of the washing apparatus is smaller than the surface area of the LCD.

EMBODIMENTS

Hereinbelow, the present invention will be explained in greater detail based on embodiments; however, the present invention is not limited to the embodiments described.

Embodiment 1

Figure 6:
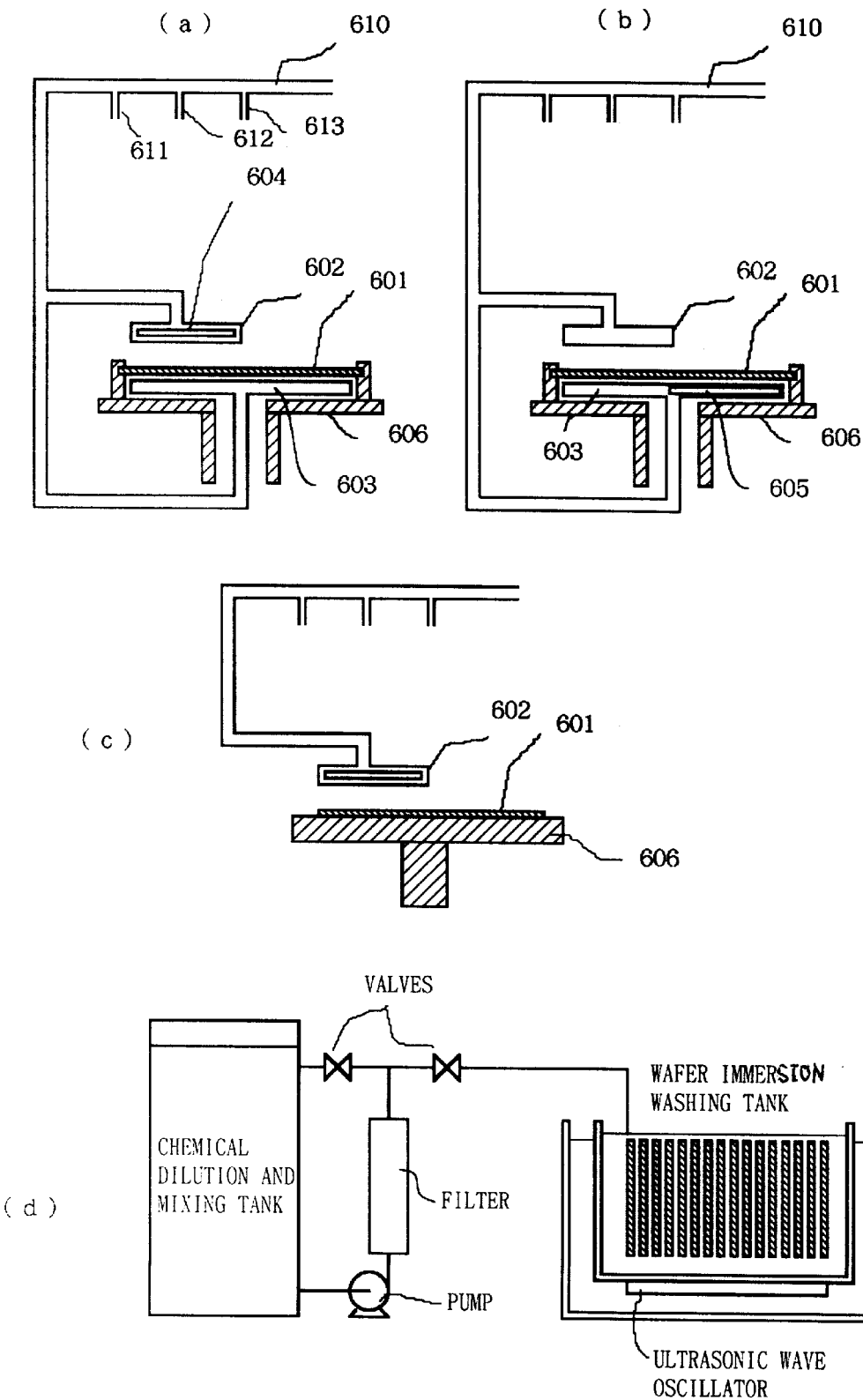
FIG. 6 is a schematic diagram showing a variety of washing methods.

Using the washing apparatuses having various washing methods shown in schematic view in FIG. 6, the particle washing of wafers was conducted while supplying a cleaning liquid comprising hydrofluoric acid, hydrogen peroxide, and a surfactant to a silicon wafer and applying ultrasonic waves.

In FIG. 6(a), a cleaning liquid obtained by injecting a specified amount of an undiluted chemical solution (hydrofluoric acid 611, hydrogen peroxide 612 and surfactant 613) into ultrapure water supply line 610 and mixing these was supplied to the front and rear surfaces of the wafer via front surface and rear surface nozzle 602 and 603 while supporting the ends of the wafer 601 and rotating; 1 MHz ultrasonic waves were applied from an ultrasonic wave oscillator 604 provided in the front surface nozzle and wafer washing was conducted (embodiment 1—1). Furthermore, in FIG. 6(b), an ultrasonic wave oscillator 605 was provided in rear surface nozzle 603, and ultrasonic waves were applied from the rear surface side (embodiment 1-2). The method in which ultrasonic waves were applied from the rear surface had a large effect as a result of the following points. Since some of the equipment relating to the ultrasonic wave oscillation was unnecessary on the upper side of the substrate, the structure was simplified, water washing of the sealed structure walls was simplified, and volume was limited so that the replacement or control of the atmosphere was made easier to carry out. Where necessary, it is of course possible to provide ultrasonic waves on the front surface nozzle as well, and to conduct washing while applying ultrasonic waves simultaneously to the front and rear surfaces.

For the purposes of comparison, washing was conducted in the same manner using the conventional spin washing method (comparative example 1—1) and the batch immersion washing method (comparative example 1–2) shown in FIGS. 6(c) and (d), and by measuring the particle count (at a diameter of 0.2 micrometers or larger) on the front and rear surfaces of the wafer after washing, the washing effects of the various washing methods were compared. The results thereof are shown together with the washing conditions in Table 1.

The composition of the cleaning liquid used was the same in all cases, and was HF:0.5%, $H_2O_2$: 0.3%, and non ionic surfactant:200 ppm.

TABLE 1

| | Embodiment 1-1 | Embodiment 1-2 | Comparative Example 1-1 | Comparative Example 1-2 |
|---|---|---|---|---|
| Wafer support | Wafer periphery | Wafer periphery | Wafer periphery | Supported on wafer carrier |
| Wafer rotation | 3000 rpm | 3000 rpm | 3000 rpm | None |
| Nozzles | Front and rear surface nozzles | Front and rear surface nozzles | Front surface nozzle | None |
| Ultrasonic wave oscillation | Wafer front surface | Wafer rear surface | Wafer front surface | Bottom surface of washing tank |
| Frequency | 1.0 MHZ | 1.0 MHZ | 1.0 MHz | 1.0 MHz |
| Cleaning liquid preparation | Injection of undiluted solution using injection pump | Injection of undiluted solution using injection pump | Injection of undiluted solution using injection pump | Preparation tank/ recycling tank, pump, filter |
| Cleaning liquid amount | 0.50 L | 0.50 L | 0.5 L | 30 L per 25 wafers |
| Washing period | 60 seconds | 60 seconds | 60 seconds | 30 minutes |

TABLE 1-continued

|  | Embodiment 1-1 | Embodiment 1-2 | Comparative Example 1-1 | Comparative Example 1-2 |
|---|---|---|---|---|
| Front surface particle count | 3 or less | 3 or less | 3 or less | 125 |
| Rear surface particle count | 15 | 3 or less | $10^3$ or more | 337 |

As shown in Table 1, the particle removal from the surface is extremely incomplete when the batch immersion washing method is employed (comparative example 1–2), and this incompleteness is thought to be a result of the following.

(1) It is difficult to achieve a uniform flow of the cleaning liquid through the spaces between the parallel wafers.

(2) The front and rear surfaces of the wafers face one another, and the contaminants from the rear surface are redeposited on the front surface.

(3) It is not possible to uniformly apply ultrasonic waves to the front and rear surfaces of the wafers.

(4) When the wafers are exposed from the liquid after washing, there is redeposition of the particles on the surface of the liquid and deposition of particles present in the air.

(5) The cleaning liquid is contaminated as a result of particles generated by the chemical supply channel and the washing tank, and this effect is present.

Furthermore, with respect to the conventional single wafer spin rotation washing apparatus which holds the rear surface of the wafers (comparative example 1—1), it is of course the case that the rear surface of the wafers cannot be washed, so that the marked contamination thereof has an effect in subsequent processes.

In comparison with comparative examples described above, the particle removal effect of the wafer front and rear simultaneous washing apparatus of the present invention (embodiments 1—1 and 1–2) is extremely strong, and in particular, when ultrasonic waves are applied to the rear surface of the wafer (FIG. 6(b)), there are washing effects on both the front and rear surfaces of the substrate.

The effects of this embodiment described above are achieved as synergistic effects by fulfilling all the conditions of rotation of the wafers with peripheral support, simultaneous formation of liquid films on the front and rear surfaces of the wafer, application of ultrasonic waves to the front and rear surfaces of the wafer, and injection and mixing of undiluted chemical solutions into the ultrapure water channel.

The effects of the wafer front and rear simultaneous washing apparatus of the present embodiment are thought to be as follows.

(1) Because the wafer is subjected to spin rotation, the contact between the front and rear surfaces of the wafer and the cleaning liquid is complete.

(2) The front and rear surfaces of the wafer are not connected to one another, and rear surface contamination is not redeposited on the front surface.

(3) The wafers are subjected to spin rotation, so that the ultrasonic waves are uniformly applied to the front and rear surfaces of the wafer.

(4) The cleaning liquid is transient and there is no redeposition of the particles, and furthermore, the apparatus is sealed, so that there is no redeposition of particles from the atmosphere.

(5) The cleaning liquid is prepared in close proximity to the wafer, and there is no particular contamination resulting from the chemical container or chemical transport channel, and the cleaning liquid is brought into direct contact with the wafer, and there is no washing container.

The washing apparatus of the present invention, that is to say, the washing apparatus which is provided with a single wafer spin rotation washing mechanism, a front and rear simultaneous washing mechanism, an ultrasonic wave application mechanism, and a chemical preparation and supply mechanism, is clearly superior to the conventional batch immersion washing apparatus in respect to the following two points.

(1) Reduction in volume of the apparatus (spatial effect)

As a result of the cleaning liquid preparation method in which undiluted chemical solutions are injected into the ultrapure water channel, the chemical supply facilities (chemical dilution and preparation tank, recycling and filtration pump, and filter system) which conventionally required an extremely large surface area are unnecessary, and only a small capacity chemical injection volumetric pump is required in the vicinity of the wafer, so that the chemical facilities and the clean room facilities are greatly reduced in size.

(2) Reduction in the amount of ultrapure water and chemicals employed (material amount effect)

The cleaning liquid preparation method in which undiluted chemical solutions are injected into the ultrapure water channel makes possible a washing period of a few seconds and the instantaneous switching of chemical washing and ultrapure water washing, and by means of this, the amount of ultrapure water and chemicals employed is dramatically reduced.

Embodiment 2

The undiluted cleaning liquid injection mechanism of the present invention injects an undiluted solution of cleaning liquid into the ultrapure water channel, and employs a capillary at the injection port. The present embodiment exhibits the effects achieved when a capillary is used.

Using a undiluted cleaning liquid injection system having the structure shown in FIGS. 4(a) and (b), a dilute hydrofluoric acid cleaning liquid was prepared, and the etching of the silicon heat oxidation film was conducted using the dilute hydrofluoric arid, and the relationships between the cleaning liquid supply method and variations in the washing were investigated.

With the exception of the supply method of the cleaning liquid, the other washing conditions were identical to those in embodiment 1—1, and the details thereof are as shown in Table 2.

The capillary 404' of FIG. 4(b) is made of sapphire and has an inner diameter of 0.25 mm and a length of 10 mm. A 50% HF aqueous solution was supplied to the ultrapure water line 403 from an undiluted solution tank 407 by means of the pump (6,000 pulses per minute) 405 shown in FIG. 5, and this was diluted approximately 100 times by the ultrapure water and was supplied to the nozzle. The chemical supply system of FIG. 4(a) employs a valve in place of the capillary.

The evaluation of the variation in washing was conducted by measurement of the thickness of the oxide film before and after etching aging an ellipsometer. The results thereof are shown in Table 3.

TABLE 2

|  | Embodiment (FIG. 4 (b)) | Comparative Example (FIG. 4 (a)) |
| --- | --- | --- |
| Tube between injection port and nozzle | Capillary tube Inner diameter: 3.18 mm Length: 50 cm Volume: (3.87 ml) | Standard tube Inner diameter: 6.35 mm Length: 50 cm Volume: 15.8 ml |
| Injection port | Capillary Inner diameter: 0.25 mm Length: 10 mm Volume: $4.9 \times 10^{-4}$ ml | Diaphragm valve Clearance volume: 0.5 ml |
| Ultrapure water water pressure | 1.0 kg/cm$^2$ | 1.0 kg/cm$^2$ |
| Ultrapure water flow rate | 1.0 L/min (16.7 ml/sec) | 1.0 L/min (16.7 ml/sec) |
| Ultrapure water flow speed | 2.2 m/sec | 0.53 m/sec |
| Injection rate of 50% HF | 10 ml/min (0.167 ml/sec) | 10 ml/min (0.167 ml/sec) |
| Injection period of 50% HF | 15 sec (1.67 ml/15 sec) | 15 sec (1.67 ml/15 sec) |

TABLE 3

|  | Embodiment | | Example | |
| --- | --- | --- | --- | --- |
|  | Average Value (nm) | Standard Deviation (%) | Comparative Average Value (nm) | Standard Deviation (%) |
| RUN 1 | 9.15 | 3.8 | 11.8 | 23.0 |
| RUN 2 | 9.08 | 4.4 | 7.18 | 26.6 |
| RUN 3 | 8.85 | 5.6 | 8.29 | 27.7 |
| Average | 9.00 | 4.6 | 9.09 | 25.8 |

As is clear from the table, the standard deviation of the distribution in film thickness of the embodiment was approximately 5%, whereas that of the conventional example was very large, at 25%.

This difference is thought to illustrate the difference in the mixing effects during injection. In other words, in the present embodiment, the undiluted solution is sprayed into the ultrapure water at a very high speed reaching 3.4 m/sec, and thereby, it is instantaneously mixed (in other words, the rate of passage of the undiluted solution through the capillary=50% HF injection rate (0.167 cm$^3$ sec)/capillary cross sectional area (0.00049 cm$^2$)=3.4 m/sec). In contrast, when injection is conducted in the normal manner from the valve port at a rate of 0.6 cm/sec into the channel in which the flow rate of the ultrapure water was less than 1 m/sec, the mixing is incomplete during the period of passage from the injection port to the nozzle (that is to say, the passage rate of the undiluted solution through the valve port=50% HF injection rate (0.167 cm$^3$/sec)/valve port cross sectional area (0.28 cm$^2$) =0.6 cm/sec). The results shown in the table indicate that the cause thereof lies in concentration distributions resulting from insufficient mixing of the cleaning liquid.

Embodiment 3

In the present embodiment, the undiluted chemical solutions are either injected into the ultrapure supply pipe or the injection thereof is halted, and the cleaning liquid concentration responsiveness was investigated when the type of cleaning liquid was altered.

The injection of the chemicals into the ultrapure water pipe was conducted using chemical supply lines having the structure shown in FIGS. 4(a) and (b), with the exception that two systems for 50% HF and 30% $H_2O_2$ were employed, and control of the pump (FIG. 5) and valves was conducted so as to obtain a 0.5% HF/0.3% $H_2O_2$ solution (5 seconds), ultrapure water (5 seconds), 0.1% HF (5 seconds), and ultrapure water (5 seconds). The form of the chemical injection system and the like was identical to that in Table 2.

The concentration of each component in the cleaning liquid sprayed from the nozzle was obtained using the conductometer and chemical analysis. The result is shown in Table 4.

TABLE 4

| | Undiluted Chemical Solution Injection Rate (ml/mn) | | Composition of Cleaning Liquid At Nozzle Outlet | | | | | |
| --- | --- | --- | --- | --- | --- | --- | --- | --- |
| | | | Embodiment (FIG. 4(b)) | | | Comparative Example (FIG. 4(a)) | | |
| Time (sec) | 50% HF | 30% $H_2O_2$ | HF % | $H_2O_2$ % | Particles per ml | HF % | $H_2O_2$ % | Particles per ml |
| Start | 0.0 | 0.0 | 0.0 | 0.0 | <1 | 0.0 | 0.0 | <1 |
| 0.0–1.0 | 10.0 | 10.0 | 0.50 | 0.30 | <1 | 0.14 | 0.08 | 856 |
| 1.0–2.0 | 10.0 | 10.0 | 0.50 | 0.30 | <1 | 0.31 | 0.18 | 760 |
| 2.0–3.0 | 10.0 | 10.0 | 0.50 | 0.30 | <1 | 0.47 | 0.28 | 513 |
| 3.0–4.0 | 10.0 | 10.0 | 0.50 | 0.30 | <1 | 0.50 | 0.30 | 680 |
| 4.0–5.0 | 10.0 | 10.0 | 0.50 | 0.30 | <1 | 0.50 | 0.30 | 335 |
| 5.0–6.0 | 0.0 | 0.0 | 0.00 | 0.00 | <1 | 0.35 | 0.21 | 153 |
| 6.0–7.0 | 0.0 | 0.0 | 0.00 | 0.00 | <1 | 0.17 | 0.13 | 86 |
| 7.0–8.0 | 0.0 | 0.0 | 0.00 | 0.00 | <1 | 0.06 | 0.05 | 77 |
| 8.0–9.0 | 0.0 | 0.0 | 0.00 | 0.00 | <1 | 0.02 | 0.02 | 56 |
| 9.0–10. | 0.0 | 0.0 | 0.00 | 0.00 | <1 | 0.01 | 0.01 | 81 |
| 10.–11. | 2.0 | 0.0 | 0.10 | 0.00 | <1 | 0.03 | 0.00 | 757 |
| 11.–12. | 2.0 | 0.0 | 0.10 | 0.00 | <1 | 0.06 | 0.00 | 684 |
| 12.–13 | 2.0 | 0.0 | 0.10 | 0.00 | <1 | 0.09 | 0.00 | 845 |
| 13.–14. | 2.0 | 0.0 | 0.10 | 0.00 | <1 | 0.10 | 0.00 | 771 |
| 14.–15. | 2.0 | 0.0 | 0.10 | 0.00 | <1 | 0.10 | 0.00 | 438 |
| 15.–16. | 0.0 | 0.0 | 0.00 | 0.00 | <1 | 0.07 | 0.00 | 320 |
| 16.–17. | 0.0 | 0..0 | 0.00 | 0.00 | <1 | 0.05 | 0.00 | 287 |
| 17.–18. | 0.0 | 0.0 | 0.00 | 0.00 | <1 | 0.02 | 0.00 | 110 |
| 18.–19. | 0.0 | 0.0 | 0.00 | 0.00 | <1 | 0.01 | 0.00 | 75 |
| 19.–20. | 0.0 | 0.0 | 0.00 | 0.00 | <1 | 0.00 | 0.00 | 150 |

As is clear from Table 4, a pipe is provided at the chemical injection port into the ultrapure water supply line, and thereby, solely by means of controlling the drive of the pump, it is possible to obtain the desired chemicals with high responsiveness. Furthermore, since there is no opening and closing of the valve, there is absolutely no generation of microparticles, and it is possible to conduct supply while maintaining the cleanliness of the ultrapure water.

Furthermore, when the pump is stopped, it is possible that chemicals from the interior of the pipe will be eluted into the ultrapure water supply line as a result of dispersion, however, when an attempt was made to measure the concentration resulting from the elution, the concentration was below the lower measurable limit (1 ppb), and could not be detected, so that it was confirmed that the dispersion isolation effect of the pipe was sufficient.

On the other hand, when a diaphragm valve is employed, it is difficult to set the clearance volume of the valve to 0.5 ml or less, and in the injection of extremely small amounts of chemicals, the effect of 0.5 ml clearance, including the amount injected, is large, and the composition of the cleaning liquid prepared varies greatly, and it is clear that the instantaneous switching of the composition is difficult.

The results of a theoretical calculation of the isolation effect of the capillary are:

HF dispersion rate in the capillary:

$$k \cdot c \cdot \pi r^2 / L = 0.25 \times 10^{-8} \text{ g/sec}$$

Dispersion concentration:

$$0.25 \times 10^{-8} \text{ g/sec} \div 16.7 \text{ ml/sec} = 0.15 \text{ ppb}$$

These are in agreement with the measured values. In the calculation, $1 \times 10^5 \text{cm}^2/\text{sec}$ was employed as the dispersion constant. Accordingly, it is also possible to use a thicker capillary.

The injection rate of the undiluted solution was 0.167 ml/sec; however, this may be as high as 9.4 ml/sec with a pump pressure of 10 $kg/cm^2$ and where a capillary is employed in which r=0.125 mm and L=10 mm. Accordingly, it is also possible to use a thinner and longer capillary.

Embodiment 4

Figure 8:
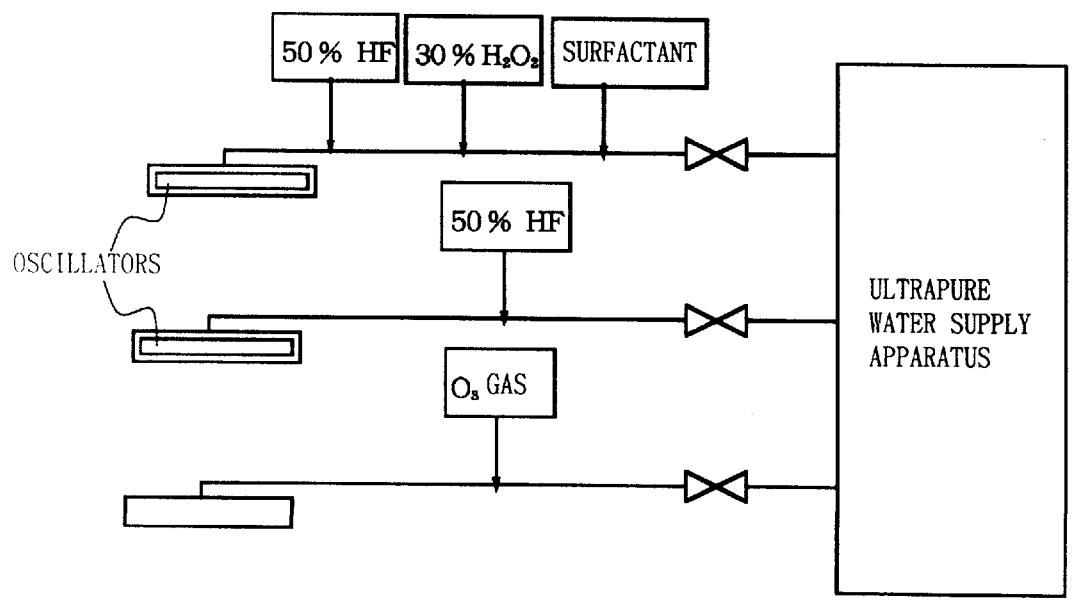
FIG. 8 is a schematic diagram showing an example of a washing apparatus used in the normal temperature washing process.

Using the washing apparatus shown in FIG. 8, silicon wafer washing processes were conducted, and the washing effects and amount of chemicals in ultrapure water employed were investigated.

The washing process consisted of the five processes shown in Table 5; the amount of chemicals employed and the washing time of each process are indicated. In Table 2, as the nozzle for surface washing, both a nozzle which conducted washing while moving in the radial direction, and a f fixed nozzle having a linear spray port were employed.

Furthermore, the rear surface nozzle was of the fixed type. The wafers were silicon wafers having a diameter of 8 inches.

TABLE 5

|  | Moving Nozzle | Stationary Nozzle |
| --- | --- | --- |
| Front Surface |  |  |
| 1) Ozone washing | 0.500 L/20 sec | 0.583 L/10 sec |
| 2) Washing with hydrofluoric acid and hydrogen peroxide | 1.000 L/40 sec | 1.750 L/30 sec |
| 3) Ozone washing | 0.250 L/10 sec | 0.292 L/5 sec |
| 4) Dilute hydrofluoric acid washing | 0.250 L/10 sec | 0.292 L/5 sec |
| 5) Ultrapure water washing | 0.250 L/10 sec | 0.583 L/10 sec |
| Rear Surface |  |  |
| 1) Ozone washing | 0.500 L/20 sec | 0.583 L/10 sec |
| 2) Washing with hydrofluoric acid and hydrogen peroxide | 1.000 L/40 sec | 1.750 L/30 sec |
| 3) Ozone washing | 0.250 L/10 sec | 0.292 L/5 sec |
| 5) Ultrapure water washing | 0.500 L/20 sec | 0.875 L/15 sec |

Here, the ozone concentration in the ozone washing was 5 ppm, the concentration of hydrofluoric acid and hydrogen peroxide were such that hydrofluoric acid was 0.5%, hydrogen peroxide was 0.3% and dilute hydrofluoric acid was 0.1%.

In the washing described above, the metals and organic materials present on the surface of the wafer were below the lower limit of detection, and there were three or fewer particles of 0.2 micrometers or less, so that it was learned that extremely satisfactory washing effects were obtained at room temperature.

Furthermore, the washing time per wafer was 90 seconds using the moving type nozzle and 60 seconds using the fixed type nozzle, so that a high throughput was obtained.

Furthermore, the amount of cleaning liquid employed per wafer was, respectively, 4.5 L and 7.0 L, and a calculation of the amount of chemicals consumed in a factory having a daily production of 1,000 8 inch wafers results in the figures shown in Table 6; it can be seen that the tanks used for storing these chemicals may also be very small.

TABLE 6

|  | Moving Nozzle | Stationary Nozzle |
| --- | --- | --- |
| 50% HF | 20.0 kg | 35.0 kg |
| 30% $H_2O_2$ | 20.0 kg | 35.0 kg |
| $O_3$ | 7.5 g | 8.8 g |

Embodiment 5

Using the washing apparatus of the present invention shown in FIG. 1, washing of 8 inch silicon wafers was conducted under the washing conditions shown in Table 5 (using a fixed nozzle). FIG. 7 shows the results of measurement of surface organic materials and boron after washing. By means of the effects of the ozonated water washing and the hydrofluoric acid washing, the concentrations of both components on the surface were reduced below the threshold of detection. As a comparison, the apparatus was opened to the clean room air, and the other conditions were identical to those of the present embodiment. At this time, the concentration of organic material (converting the concentration of all hydrocarbons to the $C_2H_4$ concentration) in the clean room atmosphere was 50–100 micrograms/$m^3$, and the boron concentration was 10–50 ng/$m^3$, and these concentrations represent average standards for the degree of cleanliness in semiconductor manufacturing clean rooms. The results obtained for these comparative examples indicate that even if the washing is completely executed, the surface of the substrate becomes contaminated as a result of contact with the clean room atmosphere. In other words, the sealed apparatus conditions are essential for the substrate washing.

TABLE 7

|   | Embodiment | Comparative Example (molecules/cm$^2$) |
|---|---|---|
| $C_2H_4$ | Below threshold detection | the $1 - 5 \times 10^{14}$ of |
| B | Below threshold detection | the $0.1 - 1 \times 10^{12}$ of |

In Table 7, conversion of the total hydrocarbon concentration to the $C_2H_4$ concentration was obtained from the strength of the absorbance in the 2870–2970 cm$^{-1}$ band in the total reflection infrared absorbance spectra. Furthermore, B was measured using a high resolution ICP mass spectrometer with respect to the surface etching solution.

Embodiment 6

Using the same apparatus as in embodiment 5, the washing of 8 inch silicon wafers was conducted.

The cleaning liquid for particle removal (a hydrofluoric acid solution blended with a nonionic surfactant) was prepared using ultrapure water subjected to deaeration treatment with a deaerating film, and this was caused to flow onto the surface of the wafer from a nozzle equipped with an oscillator for 2 MHz ultrasonic waves. At this time, the interior of the sealed apparatus was maintained at a reduced pressure of approximately 100 Torr. An evaluation of the number of particles on the surface after washing was conducted, and the results of this evaluation are shown in Table 8. As a result of the effects of the deaerated cleaning liquid and the ultrasonic waves within the sealed reduced pressure apparatus, good removal of the particles on the wafer surface was achieved.

For the purposes of comparison, the apparatus was opened to the clean room air, and washing was conducted under conditions identical to those of the present embodiment with the exception that a cleaning liquid from which dissolved air had not been removed was employed.

In this case, because air was dissolved in the cleaning liquid (an $O_2$ concentration of 8 ppm), air bubbles were generated by the application of ultrasonic waves, and there was a resulting reduction in the sound pressure of the ultrasonic waves, and the particle removal effect of the ultrasonic waves was reduced. In other words, the sealed apparatus conditions are essential to achieve particle removal.

TABLE 8

| Measured Diameter (micrometers) | Particle Embodiment | Comparative Example |
|---|---|---|
| <0.2 | 4 | 15 |
| 0.2–0.5 | 2 | 7 |
| 0.5–1.0 | 2 | 11 |
| >1.0 | 3 | 17 |
| $O_2$ concentration (ppm) | <1 | 8 |

Embodiment 7

As shown in FIG. 7, while mixing two types of undiluted solutions, hydrofluoric acid (HF 50%) and hydrogen peroxide ($H_2O_2$ 30%) at a ratio of 1.00:1.67 and diluting this approximately 100 times using ultrapure water, a cleaning liquid (HF 0.50%, $H_2O_2$ 0.50%) was prepared, so that capillaries were installed between the individual undiluted solution containers and the pump intake ports.

In Table 9, the shape of the capillaries used in undiluted solution supply is shown. The flow rate ratio of the capillaries employed can be calculated from the formula so as to achieve a ratio of 1.00;1.67. Such capillaries were installed and two types of undiluted solutions were injected into the ultrapure water channel using a single pump. The ratio of the pump injection rate to the ultrapure water flow rate was set to 1/100, and it was thus possible to supply the desired cleaning liquid of HF 0.50% and $H_2O_2$ 0.50%.

TABLE 9

| Undiluted Solution | Capillary Radius (cm) | Capillary Length (cm) | Relative Ratio of Injection Speeds by the Capillary | Cleaning liquid Composition |
|---|---|---|---|---|
| 50% HF | 0.025 | 3.34 | 1.00 | HF 0.5% |
| 30% $H_2O_2$ | 0.025 | 2.00 | 1.67 | $H_2O_2$ 0.5% |

Embodiment 8

Figure 10:
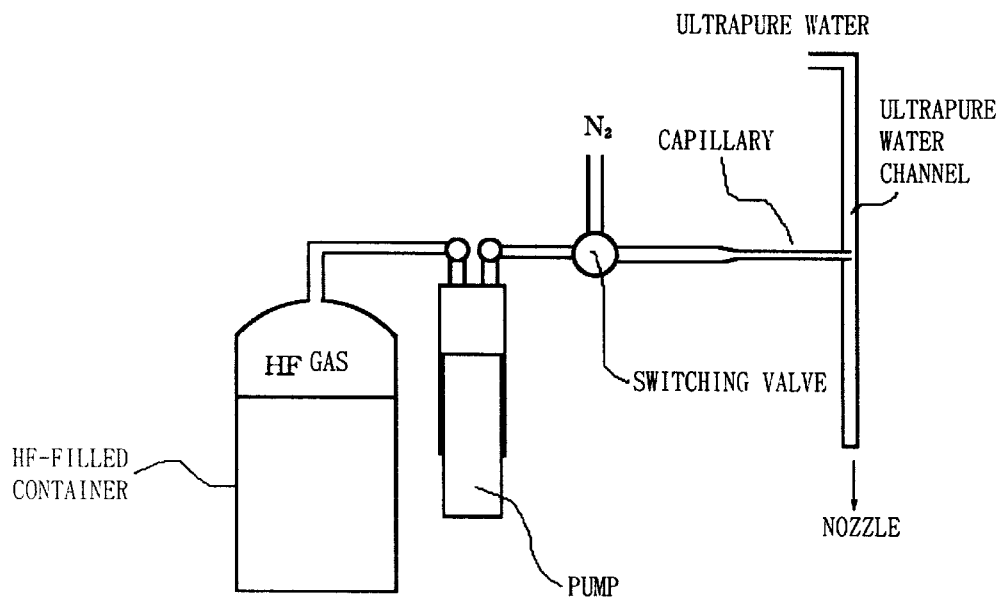
FIG. 10 is a schematic diagram showing an injection apparatus for hydrogen fluoride gas.

Using the injection apparatus for hydrogen fluoride gas shown in FIG. 10, and altering the dimensions of the sapphire capillaries provided between the ultrapure water channel and the pump, the penetration of the water during the introduction of hydrogen fluoride gas was investigated. The results are shown in Table 10.

When the water gas flow rate ratio in the capillary is 1.0 or greater, the liquid penetrates into the capillary and the metal line. Furthermore, when the water/gas flow rate ratio is 1.0 or less, and certainly 0.5 or less, as a result of the capillary action, it is possible to carry out the continuous instantaneous solutions. In other words, there are capillary dimensional conditions (diameter and length) which do not produce penetration with respect to the hydrogen gas flow rate and the nozzle water pressure.

As an example, when the hydrogen fluoride gas supply rate was 400 ml/min, and the ultrapure water nozzle flow rate was 1.0 L/min (a nozzle water pressure of 0.1–0.2 kg/cm$^2$), using a sapphire capillary having an inner diameter of 1 mm and a length of 100 mm, instantaneous dissolution of the hydrogen fluoride gas was achieved without causing penetration, and it was possible to cause a continuous outflow of a dilute aqueous solution of hydrofluoric acid having a HF concentration of 0.5%.

TABLE 10

| Water/Gas Flow Speed Ratio in Capillary | 0.25 | 0.50 | 0.75 | 1.00 | 1.25 | 1.50 |
|---|---|---|---|---|---|---|
| Liquid Penetration into Capillary | Absent | Absent | Absent* | Absent-Present | Present | Present |

Absent-Present: borderline liquid penetration,
Absent*: Penetration of the liquid into the capillary is observed in some cases as a result of changes in the "water/gas flow rate ratio" conditions depending on fluctuations in the hydrogen fluoride gas supply rate and the nozzle water pressure.

Embodiment 9

Figure 11:
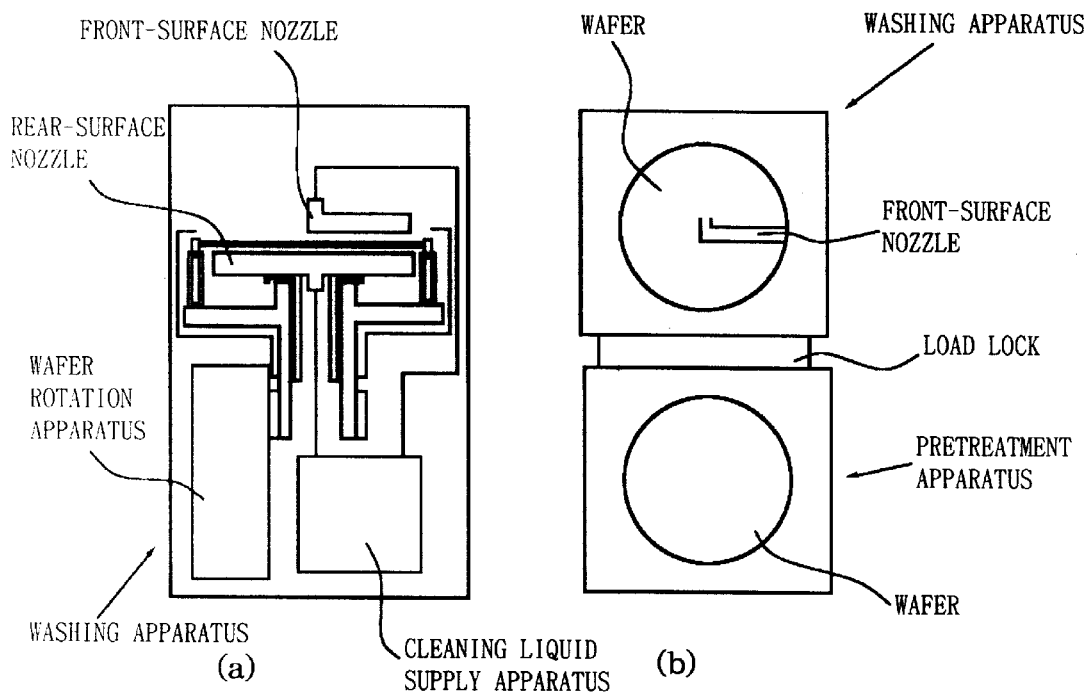
FIG. 11 is schematic diagram showing the structure of the washing apparatus of embodiment 10.

FIG. 11 shows an example of a structure in accordance with the present invention which is a silicon wafer washing apparatus. (a) shows a front view, while (b) shows a top view.

The apparatus, is a rotating apparatus in which the wafer is rotated while being supported at the periphery thereof; this comprises a fixed front surface nozzle and rear surface nozzle provided with ultrasonic wave oscillators above and below the wafer, and an apparatus for supplying cleaning liquids to these nozzles.

The rotation apparatus and the cleaning liquid supply apparatus are contained within the scope of the projected surface area of the wafer below the wafer support mechanism. Apart from the connection of the cleaning liquid supply apparatus and the small volume undiluted solution containers using capillaries, facilities for chemical storage, dilution, mixing, piping and transportation, recycling and filtration, and pump supply and the like are not required.

As shown in FIG. 11(b), the present washing apparatus may be directly connected with the wafer preprocessing apparatus via a load lock, and it is possible to thus make the manufacturing and further working completely unitary with washing and drying.

Embodiment 10

In the system of FIG. 4(b) for injecting an undiluted chemical solution into an ultrapure water channel via a capillary, capillary 404' and pump 405 are connected by means of a flexible tube, and a solenoid (a plunger type electromagnetic device) which puts external pressure on this tube in a very small volume is installed. The solenoid is connected to the pump drive electrical circuit, and compresses the flexible tube when the pump is being driven. The compressed volume is set to approximately 0.001 ml when the capillary 404' has an internal diameter of 0.25 mm, a length of 10 nm and an internal volume of 0.0005 ml.

When the pump is on standby, the pressure applied by the solenoid is released, and as a result of the reestablishment of the tube volume, the ultrapure water within the capillary is drawn out, and thereby, it is possible to prevent in dramatic fashion the dispersion of chemicals into the ultrapure water channel, and as a result, it is possible to conduct switching of the cleaning liquids quickly and with an even higher degree of responsiveness.

Industrial Applicability

By means of the washing apparatus of the present invention, it is possible to reduce in size wet spin rotation systems, ultrasonic wave oscillation systems, wafer front and rear washing systems, wafer drying systems, and chemical mixing and supply systems and the like, and it is possible to contain all the apparatuses necessary for wafer washing within a small installed surface area in which one side is approximately twice the diameter of the wafers.

Furthermore, when the present invention is applied to LCD washing apparatuses, by employing a mechanism in which at least one of the substrate and the cleaning liquid supply mechanism is caused to move in one direction, it is possible to effectively achieve a high degree of cleanliness, and moreover, it is possible to house all the apparatuses and the like which are required for LCD washing in a surface area less than or equal to the surface area of the LCD.

As a result, it is possible to directly connect the washing apparatus with various types of wafer processing apparatuses, that is to say, with apparatuses for conducting oxidation and dispersion, epitaxial growth, silicide formation, thin film formation, ion implantation, dry etching, and heat treatment; that is to say, it is possible to make the wafer treatment spatially unitary with the wafer washing, so that contamination of the wafers during wafer transport and the like may be prevented, and the wafers may be constantly maintained in a state of high cleanliness, thus making possible manufacture of devices which are more highly integrated and more functional.

What is claimed is:

1. A washing apparatus which is provided with: an undiluted cleaning liquid injection means for injecting an undiluted solution of a cleaning liquid into an ultrapure water channel via a capillary and producing a cleaning liquid of a desired concentration, a cleaning liquid supply means for supplying a cleaning liquid prepared at a desired concentration simultaneously to front and rear surfaces of a substrate, which is connected to said ultrapure water channel, a means for superposing high frequency sound waves of 0.5 MHz or more on said substrate via said cleaning liquid, and a means for moving either of said substrate and said cleaning liquid supply means in one direction; which is capable of continuously conducting washing of a substrate by means of a cleaning liquid and washing by means of ultrapure water, by means of controlling injection of said undiluted solution into said ultrapure water channel.

2. A washing apparatus in accordance with claim 1, wherein at least said substrate and said cleaning liquid supply means are disposed within a sealed container, and substrates are washed in an inert gas atmosphere isolated from the outer atmosphere.

3. A washing apparatus in accordance with claim 1, wherein said ultrapure water is subjected to deaeration treatment, and the concentration of dissolved gases therein is controlled.

4. A washing apparatus in accordance with claims 1, wherein said cleaning liquid supply means supplies cleaning liquid simultaneously to front and rear surfaces of a substrate using a nozzle which moves between the center and the periphery of said substrate.

5. A washing apparatus in accordance with claim 4, wherein said means for superposing high frequency sound waves of 0.5 MHz or more comprises installation of oscillators in said nozzles disposed on one side of front and rear surfaces of said substrate or at non overlapping positions on both surfaces for applying ultrasonic waves or high frequency sound waves of 0.5 MHz or more in the direction of said substrate.

6. A washing apparatus in accordance with claim 5, wherein, when said ultrasonic waves or high frequency sound waves of 0.5 MHz or more are applied from one side of said substrate, an angle of incidence of said ultrasonic waves or high frequency sound waves of 0.5 MHz or more with respect to said substrate is set so that sound pressure of said ultrasonic waves or high frequency waves of 0.5 MHz or more at an opposite surface of said substrate from the surface of incidence is approximately maximal.

7. A washing apparatus in accordance with claim 4, wherein said undiluted cleaning liquid injection means comprises a pump connected to said ultrapure water channel and an undiluted solution container or undiluted gas container for cleaning liquid, and injects undiluted solution or undiluted gas at a predetermined rate into said ultrapure water channel and supplies this as a cleaning liquid of predetermined concentration to said nozzles.

8. A washing apparatus in accordance with claim 7, wherein a capillary satisfying the relationships shown in formulas (1) and (2) below is provided between said pump and said ultrapure water channel, and by means of spraying an undiluted solution of cleaning liquid from said capillary into said ultrapure water channel, the injected undiluted solution and ultrapure water are instantaneously mixed.

$$V/t = (\pi r^4 \cdot P \cdot G)/(8\eta \cdot L) \tag{1}$$

$$k \cdot c \cdot \pi r^2 / L < 1 \times 10^{-7} \text{g/sec} \tag{2}$$

(Here, V/t indicates the undiluted solution injection rate per unit time(cm$^3$/sec), r indicates the radius of the capillaries (cm), L indicates the length of the capillaries (cm), η indicates the liquid viscosity (g/(cm sec)), P indicates the pump injection pressure (g/cm$^2$), G indicates the gravitational acceleration (cm/sec$^2$), k indicates the dispersion constant (cm/sec) and c indicates the cleaning liquid component concentration (cm$^3$)·).

9. A washing apparatus in accordance with claim 8, wherein a plurality of undiluted solution containers are connected to said pump via capillaries having a plurality of differing values of r$^4$/L, and by setting r$^4$/L, the supply rate of each undiluted solution taken into said pump is controlled, and undiluted solutions of an arbitrary composition are injected into said ultrapure water channel.

10. A washing apparatus in accordance with claim 7, wherein said pump moves a piston member provided within a cylinder part connected to an undiluted solution suction intake part and a discharge part by means of a one-dimensional feed mechanism using a motor, and conducts the suction intake and discharge of said undiluted solution and undiluted gas.

11. A washing apparatus in accordance with claim 1, wherein said undiluted cleaning liquid injection means is a means for injecting hydrogen fluoride gas into said ultrapure water channel and preparing a dilute hydrofluoric acid cleaning liquid having a desired concentration, and an anhydrous hydrogen fluoride filled container is connected to said ultrapure water supply channel via a pump, a switching valve between hydrogen fluoride and a purge gas, and a capillary, and a water/hydrogen fluoride gas flow ratio within said capillary is 0.5 or less.

12. A washing apparatus in accordance with claim 1, wherein said undiluted cleaning liquid injection means is a means for injecting ozone gas into said ultrapure water channel, and for preparing ozonated water cleaning liquid having a desired concentration, and said ultrapure water channel is connected via a valve to a container, and an ultrapure water discharge pipe provided at said container is connected to said cleaning liquid supply means, and an ozone gas inlet port and an ozone gas discharge port are provided in a lower part and upper part of said container, where said ozone gas inlet port is connected to an ozone gas source, while said ozone gas discharge port is connected to an ejector.

13. A washing apparatus in accordance with claim 1, wherein said undiluted solution or undiluted gas contains hydrofluoric acid, ozone, hydrogen peroxide, or hydrogen fluoride.

14. A washing apparatus in accordance with claims 1, wherein, in parts supporting end parts of said substrate, parts of said nozzles, parts isolating said oscillators from said cleaning liquid, and said pumps or capillaries, those parts in contact with said cleaning liquid or the undiluted solutions or undiluted gases comprise quartz, silicon, silicon carbide, alumina, sapphire, amorphous carbon, or metals, the surfaces of which are passivated by oxide films or fluoride films, or fluorine resin or another corrosion-resistant resin.

* * * * *